United States Patent [19]

Hershcovitch et al.

[11] Patent Number: 4,942,339
[45] Date of Patent: Jul. 17, 1990

[54] INTENSE STEADY STATE ELECTRON BEAM GENERATOR

[75] Inventors: Ady Hershcovitch, Mount Sinai; Vincent J. Kovarik, Bohemia; Krsto Prelec, Setauket, all of N.Y.

[73] Assignee: The United States of America as represented by the United States Department of Energy, Washington, D.C.

[21] Appl. No.: 249,813

[22] Filed: Sep. 27, 1988

[51] Int. Cl.⁵ .............................................. H01J 29/00
[52] U.S. Cl. .......................... 315/111.81; 315/111.01; 315/111.31; 313/231.01; 250/423 R; 250/492.3
[58] Field of Search .................. 315/111.01, 111.21, 315/111.31, 111.81; 313/231.01; 250/423 R, 492.3

[56] References Cited
U.S. PATENT DOCUMENTS

| 2,975,277 | 3/1961 | Von Ardenne | 250/295 |
| 3,373,304 | 3/1968 | Lustig | 313/161 |
| 3,409,525 | 11/1968 | Chopra et al. | 313/231.01 X |
| 3,411,035 | 11/1968 | Hecker et al. | 315/111.81 |
| 3,955,091 | 5/1976 | Robinson et al. | 315/111.31 X |
| 4,687,938 | 8/1987 | Tamura et al. | 315/111.81 X |
| 4,749,912 | 6/1988 | Hara et al. | 315/111.31 X |

Primary Examiner—Eugene R. LaRoche
Assistant Examiner—Do Hyun Yoo
Attorney, Agent, or Firm—Vale Myles; William R. Moser; Richard E. Constant

[57] ABSTRACT

An intense, steady state, low emittance electron beam generator is formed by operating a hollow cathode discharge plasma source at critical levels in combination with an extraction electrode and a target electrode that are operable to extract a beam of fast primary electrons from the plasma source through a negatively biased grid that is critically operated to repel bulk electrons toward the plasma source while allowing the fast primary electrons to move toward the target in the desired beam that can be successfully transported for relatively large distances, such as one or more meters away from the plasma source.

15 Claims, 2 Drawing Sheets

INTENSE STEADY STATE ELECTRON BEAM GENERATOR

This invention was made with Government support under contract number DE-AC02-76CH00016, between the U.S. Department of Energy and Associated Universities, Inc. The Government has certain rights in the invention.

BACKGROUND OF THE INVENTION

Present day electron beam ion sources operate with electron beam currents of less than 1 ampere. If commercially practical sources could be built for generating electron beams having multi-ampere outputs, numerous applications are known to exist for such high current sources. Most such applications require electron beams that operate on a steady state basis, or with very long pulses of current, and that also have low emittance. It is generally known that plasma generating cathode devices can readily yield multi-ampere currents of electrons, however, it is also generally known that such high current sources are characterized by having very high emittances. Thus, one skilled in the art of electron beam generators would not ordinarily look to plasma cathode sources for the production of electron beams that must be designed to have low emittance.

Currently available plasma cathode beam sources, due to their high emittance, have found very limited practical application, which is mostly limited to exciting molecules in powerful gas lasers. For most other current applications of electron beams, the beams are injected from guns that utilize either thermionic cathodes or photocathodes in which electrons are emitted from a surface and have energy spreads of 0.5 electron volts (eV) or less. Such limited energy spreads are relatively small, compared to the energy spreads of at least several eV for beams produced from plasma generators. Although such narrow energy spreads are desirable for many potential beam applications, the inherent space charge problems of currently used surface emitted electron sources pose severe limitations on the total steady state, or reasonably long pulsed, electron currents that can be extracted from such surface electron emitters. Other types of surface electron emitters, such as semiconductor photoemitters, have a further inherent limitation in that they can only generate very short pulses of output beam current, when operated to produce high current beam outputs.

OBJECTS OF THE INVENTION

A primary object of the present invention is to provide an electron beam generator that is operable to produce an intense, steady state, low emittance beam that can be successfully transported for distances in excess of one meter.

Another object of the invention is to provide a plasma generator in combination with a control grid that is operable to permit a beam of fast primary electrons to be extracted from a generated plasma while repelling bulk electrons back toward the plasma source.

Yet another object of the invention is to provide a hollow cathode discharge plasma generator in combination with pressure regulating means for establishing a critical pressure between the cathode and anode of the generator, and in further combination with a negatively biased control grid that is operable to allow fast primary electrons from the plasma generator to pass through the grid, while repelling bulk electrons back toward the plasma generator, in response to a critical bias voltage being applied to the grid, while said critical pressure is maintained on the source plasma.

Still another object of the invention is to provide an electron beam generator that is capable of producing an intense, steady state, low emittance electron beam of several amperes output that can successfully transport electrons for distances of more than one meter away from said generator.

Additional objects and advantages of the invention will become apparent from the description of it presented herein, considered in conjunction with the accompanying drawing.

SUMMARY OF THE INVENTION

In a preferred embodiment of the invention, an intense, steady state, low emittance electron beam generator is provided by mounting a hollow cathode discharge plasma source in a pressure controlled atmosphere. An extraction electrode and a target are mounted in spaced relationship away from the plasma source and are electrically charged to extract a beam of electrons from the source and toward the target. An electrically biased grid is positioned between the plasma source and the extraction electrode and is negatively biased at a critical voltage so that it operates to repel bulk electrons from the plasma source back toward the source, while allowing fast primary electrons to pass through the grid into a beam created by the extraction electrode and thence toward the electrically charged target. The beam of fast primary electrons is capable of being successfully transported at multi-ampere levels for relatively large distances, i.e. for distances well in excess of a meter and, if desired in given applications, for distances of several meters.

DESCRIPTION OF THE PREFERRED EMBODIMENT

Figure 1:
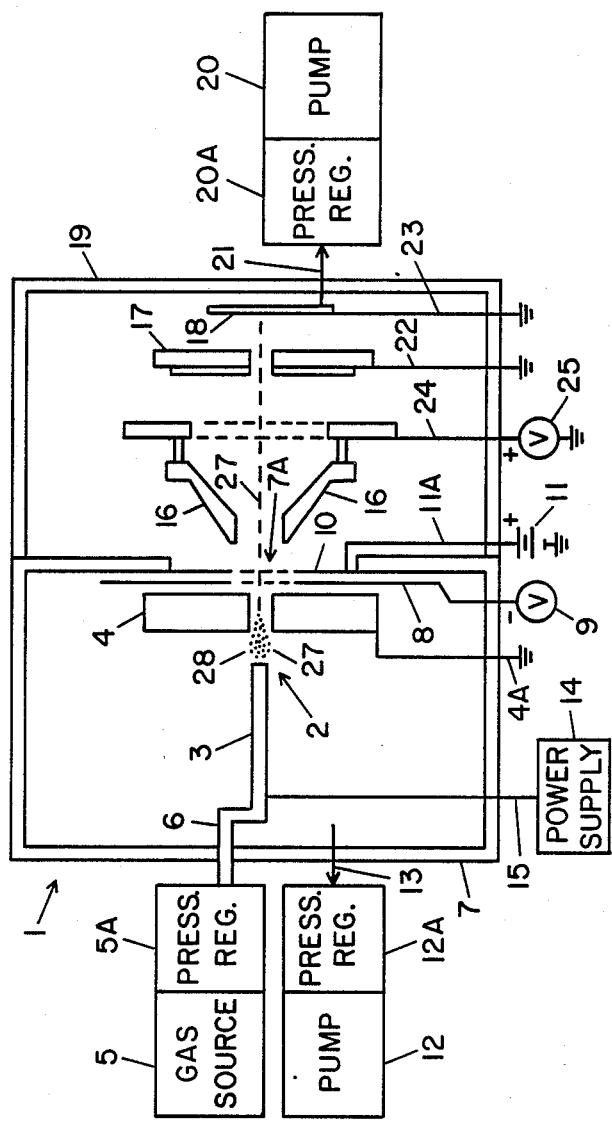
FIG. 1 of the drawing comprises a schematic side plan view of an electron beam generator that is constructed according to the present invention.

A preferred embodiment of the invention is described herein with reference to FIG. 1 of the drawing, which illustrates characteristic components and structural arrangements of that preferred embodiment. From the teaching of the invention presented herein, it will be apparent to those skilled in the art that various modifications and improvements of the invention may be made without departing from its true scope. As is shown in the drawing, the preferred embodiment of the invention comprises an intense, steady state low emittance electron beam generator 1 that comprises a hollow cathode discharge (HCD) plasma source 2, which includes a conventional hollow cathode discharge tube 3 mounted in spaced relationship to an anode 4. A suitable gas is supplied to cathode 3 from a conventional gas source 5 through a pressure regulating means 5A and tube 6 that extends into the housing cylinder 7, in sealed relationship therewith, all in a well-known manner. In practicing the present invention a variety of different kinds of HCD plasma generating sources may be used. For the convenient reference of the reader, a number of such suitable HCD generator sources are described and illustrated in more detail in U.S. Pat. No. 4,728,862, which issued Mar. 1, 1988, and the teachings of which are incorporated herein by reference.

In the preferred embodiment of the invention, the cathode tube 3 is spaced about 9 mm from the anode 4 in order to maximize the generation of plasma while minimizing scattering of primary electrons and hence broadening their energy spread, but it will be recognized that in other plasma generator arrangements different cathode-to-anode spacings may be more optimum. The cylindrical steel housing 7 is provided with an output aperture 7A through which a beam of electrons is extracted during operation of the invention. Mounted over that aperture is a grid 8 in the form of a fine-mesh metal screen. The grid 8 is electrically insulated from the housing 7 by a suitable means (not shown) and is connected to a conventional power supply 9 or other suitable source of bias voltage, that is operable to apply a critical negative bias to the grid, as will be more fully explained below. Although it is not always necessary to the achievement of successful operation of the invention, in certain applications, in the preferred embodiment illustrated in the drawing, an ion repelling grid 10 is also mounted over the aperture 7A and is connected as shown by an insulated conductor 11A to a battery 11 that applies a positive biasing voltage to the grid 10, when the invention is operated as intended to produce an electron beam that is to have a particularly low emittance.

A vacuum pump 12 and associated pressure regulator 12A are connected by a suitable conventional conduit 13 to the interior of the housing 7, as shown, and is operable to develop a desired critical ambient pressure around the plasma source 2, which source is generated by operation of the hollow cathode tube 3 and anode 4 at their optimum generating voltages. A negative voltage is applied from a conventional power supply 14 through a suitable conductor 15 which is insulated from the housing 7 and is connected to the cathode tube 3. In this embodiment, the anode 4 is connected to ground by a suitable conductor 4A.

A centrally-apertured electrode 16 is mounted in a suitable conventional manner in series with an apertured target electrode 17, a second solid target 18, and in spaced relationship from the plasma source 2. In the preferred embodiment, target 18 is a measuring instrument; but in other applications of the invention, such as in electron beam welding, the target 18 would be the electrically grounded workpiece being welded. These elements are also housed in a conventional manner within a sealed housing 19, which may be either mounted in sealing relationship to the housing 7, as shown, or which may be formed as a separate housing in other embodiments of the invention. A vacuum pump 20 having a conventional pressure regulator means 20A, is connected by a conventional conduit 21 to provide means for establishing a desired pressure within the housing 19. In the form illustrated in FIG. 1, both of the target electrodes 17 and 18 are electrically connected, respectively, to ground potential by suitable conductors 22 and 23 and the extraction electrode is connected by a suitable insulated conductor means 24 to a conventional power supply 25 that provides a regulated positive output voltage on the conductor 24, and a related electric charge on extraction electrode 16. However, those skilled in the art will recognize that in normal practice, for safety reasons and to enable sensitive measurements to be made, the whole source assembly (3, 4, 8, etc.) will be floated at a voltage the magnitude of which is equal to the extractor voltage, but with an opposite polarity.

In order to enable the unique electron beam generator 1 of the invention to operate successfully to produce an electron beam 27 that can be successfully transported for relatively large distances away from the plasma source 2, according to the invention, it is necessary to operate the component parts of the invention within certain critical parameters. Given the fact that a primary objective of the invention is to produce an electron beam 27 that is intense and steady state, as well as having a low emittance, it should be understood that it is necessary to extract fast primary electrons 27' from the plasma source 2, and from there into beam 27. The dual populations of both bulk electrons and fast primary electrons in the plasma source 2 are thus separated in practicing the invention. The plasma source is also carefully controlled to produce a population of fast primary electrons 27' by operating a pressure regulating means, such as pump 12 and regulator 12A or other suitable, alternative, pressure regulating means to establish an ambient pressure around the plasma source 2 that is about $1.8 \times 10^{-5}$ torr. That pressure level has been found to be critical in successfully forming the desired high density of fast primary electrons in the source of plasma 2, so that a multi-ampere beam 27 of such electrons can be produced.

It is also critical that an electric potential in the range of $-30$ to $-80$ volts be supplied from the power supply 14 to the HCD tube 3, when the anode 4 is biased to zero or ground voltage. A suitable gas, such as argon is pumped from the gas source 5 through the pressure regulator means 5A and the tube 3 into the area between the cathode tube 3 and anode 4 to establish a plasma 2 when the temperature of cathode tube 3 is maintained in a range of about 1300° C. to 2500° C. We have found that these operating parameters are capable of producing a population of bulk electrons 28 in a density range of about $10^{13}$ to $10^{15}$ bulk electrons per cu. cm. with a temperature spread of a few eV, i.e., 10 ev or less, while simultaneously producing a population of fast primary electron 27' in the plasma source 2 in a density of about $10^9$ to $10^{12}$ fast primary electrons per cu. cm. The foregoing critical parameters for the preferred embodiment are also effective to cause said fast primary electrons to have an energy that is about equal to that of the cathode potential, i.e. the particular potential in the range of $-30$ to $-80$ volts that is applied in operating a given case to the cathode tube 3. Those parameters are also effective to cause the fast primary electrons to have a thermal spread that is close to that of the hollow cathode tube (3) temperature and that is in the range of about 0.1 to 0.4 eV.

In order to successfully extract the desired beam of fast primary electrons 27' from the plasma source 2 (consisting of bulk electrons 28 and fast primary electrons 27'), the extraction electrode 16 has a positive extraction voltage in the range of 10's of kilovolts (kV) applied to it from the power supply 25. It will be appreciated that in given applications of the invention a variety of different extraction voltages may be used, but it is believed that an extraction voltage of at least 1.5 kV will be required even when other critical parameters in the operation of the invention are varied to optimize the performance of the plasma generator and electron beam focusing means. Both the apertured target 17 and the solid target 18 are electrically connected to ground or zero voltage and are suitably electrically insulated from the housing 19 in the disclosed embodiment. It will be understood that different applications of the invention will use different targets. As mentioned earlier, target 18 may be a measuring instrument in some application and it may be desirable to place a small positive charge on it, to prevent secondary emissions of electrons. The pump 20 and pressure regulating means 20A are operated to establish a very low ambient pressure within the housing 19. In the preferred embodiment of the invention, that established ambient pressure within the housing 19 is about $10^{-10}$ torr, but it will be appreciated that higher or lower pressures may be successfully used in given applications of the invention, provided they do not unduly raise the emittance of the beam 27 needed for such other applications.

Figure 2:
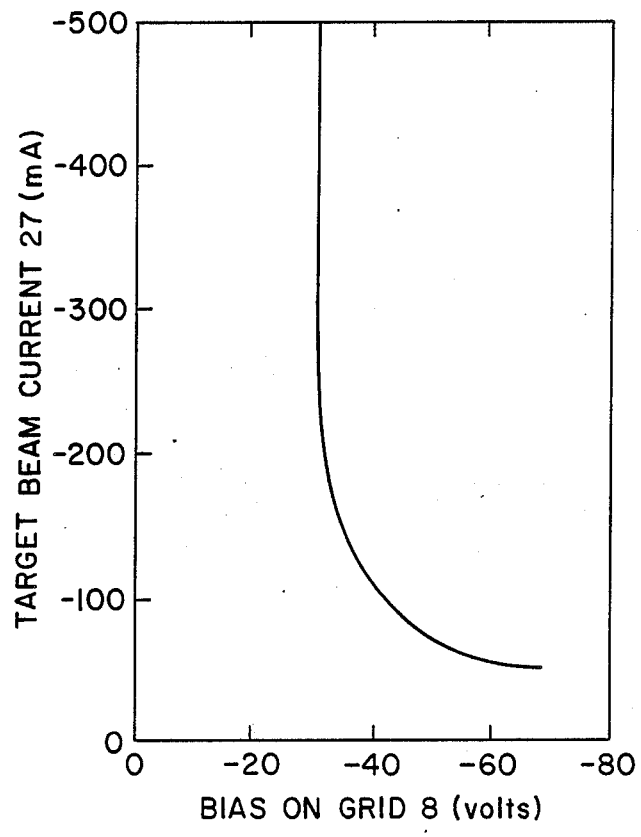
FIG. 2 is a graph of target beam current as a function of bulk electron repelling grid bias voltage, for an embodiment of the invention.

It has been found that the object of extracting a multi-ampere beam 27 of fast primary electrons from the plasma source 2 can only be done effectively when the grid 8 is biased to a certain critical voltage range. In the preferred embodiment being described, with the above-noted critical parameters established, the grid 8 is negatively biased in the range of about $-34$ to $-32$, volts from the power supply 9. As is illustrated in the graph shown in FIG. 2, a plot of target beam current in milliamperes for the electron beam 27, relative to the negative bias voltage applied to grid 8, shows the beam current increases sharply within that critical range of voltages, to a beam current in excess of 500 milliamperes at about $-33$ volts. In fact, we have found that beam currents of 10 to 15 amperes can be produced with the preferred embodiment of the invention when operated within the critical parameters explained above, and with a charge of about 2.5 Kv applied to the extraction electrode 16.

It is also important to understand that we were unable to operate the preferred embodiment of the invention to produce a multi-ampere current beam of fast primary electrons 27' when the background pressure of the plasma source 2 ambient was appreciably above $1.8 \times 10^{-5}$ torr. Thus, it is apparent that successful operation of the invention requires the above-described critical control of both the pump 12 and regulator 12A, or other suitable pressure regulating means, and pump 5 or pressure regulating means 5A, as well as establishing the critical bulk electron repelling biasing voltage on the grid 8. In the successful mode of operation of the preferred embodiment, it has been found that the grid 8 repels the bulk electrons back toward the plasma source 2, while allowing the fast primary electrons 27' to pass through grid 8 into the beam 27, that is formed by the operation of the extraction electrode 16 and the apertured target 17. In the preferred mode of operation of the invention, the beam of fast primary electrons 27' has been found to comprise at least 90% fast primary electrons, with the remainder of the beam being made up of bulk electrons or ions. The emittance of beam 27 can be reduced by applying a positive biasing voltage of $-10$ volts to the grid 10, thereby to block ions from entering the beam 27 from plasma source 2.

From the foregoing description it will be apparent that various modifications and alternative embodiments of the invention may be developed by those skilled in the art, without departing from the true scope or limits of the invention, which are more specifically defined by the following claims.

We claim:

1. An intense, steady state, low emittance electron beam generator comprising a hollow cathode discharge plasma source consisting of a cathode, an anode mounted in spaced relationship to the cathode, a housing surrounding the cathode and anode, pressure regulating means for controlling the ambient pressure between the cathode and anode, power supply means for establishing a discharge voltage between the cathode and anode to generate a plasma source that is operable at a cathode temperature in the range of about 1300° C. to 2500° C. and at an electric potential in the range of $-30$ volts to $-80$ volts, thereby to simultaneously produce bulk electrons and fast primary electrons, said fast primary electrons being made to have an energy that is about equal to that of the cathode potential and to have a thermal spread that is close to that of the cathode temperature and within the range of about 0.1 to 0.4 eV, and a pressure regulating means operably connected to supply a preselected gas to the cathode from a source of gas, and further gas pressure regulating means operably connected to maintain the ambient gas pressure between the cathode and anode in a range of about $1.85 \times 10^{-5}$ torr, in combination with an extraction electrode means that is spaced from the plasma source for extracting a beam of said fast primary electrons from the plasma source and for directing the electron beam toward a target, said target being mounted in spaced relationship to the plasma source, and a second housing disposed around the extraction electrode and target, a pump operably connected to maintain a predetermined pressure within said second housing, and a bulk electron repelling grid operably positioned serially between the plasma source and said extraction electrode means, said grid being operably connected to a source of voltage that is effective to negatively bias the grid to a predetermined negative voltage that causes the grid to repel said bulk electrons away from the target while allowing the fast primary electrons from said plasma source to pass through the grid and move toward the target in a beam having a current in excess of 500 milliamperes, said beam being comprised primarily of fast primary electrons.

2. An invention as defined in claim 1 wherein said predetermined negative voltage on the bulk electron repelling grid is in the range of the anode to cathode arc voltage.

3. An invention as defined in claim 2 wherein said beam of fast primary electrons is a multi-ampere beam.

4. An invention as defined in claim 3 wherein said multi-ampere beam is in the range of 10 to 20 amperes.

5. An invention as defined in claim 1 wherein said target is spaced at least 10 cm. from said plasma source.

6. An invention as defined in claim 5 wherein said target is spaced at least 1 meter from said plasma source.

7. An invention as defined in claim 1 wherein said cathode is spaced about 9 mm from said anode.

8. An invention as defined in claim 1 including an ion repelling grid mounted between said plasma source and the extraction electrode, and a source of bias voltage operably connected to said ion repelling grid to cause it to operate to repel ions away from said target and toward the plasma source, thereby to maintain the emittance of the fast primary electron beam at a low emittance.

9. An invention as defined in claim 8 wherein said relatively low emittance is in the range of 0.132 cm-milliradians to 0.262 cm-milliradians.

10. An intense, steady state, low emittance electron beam generator comprising a source of plasma consisting of dual populations of predetermined densities of high emittance bulk electrons and low emittance fast primary electrons, extraction electrode means spaced from said source and electrically charged to extract both bulk electrons and fast primary electrons from said source and to form the extracted fast primary electrons into a beam, and a negatively biased grid positioned between said source and the extraction electrode, said grid being biased to a predetermined voltage that is effective to repel said extracted bulk electrons back toward said source while allowing said extracted fast primary electrons to pass through the grid and be directed by said extraction electrode into an intense, steady state, low emittance beam of at least 500 milliamperes that can transport the fast primary electrons for distances in excess of one meter from said source.

11. An invention as defined in claim 10 wherein said beam of fast primary electrons is a multi-ampere beam.

12. An invention as defined in claim 11 wherein said source of plasma includes a hollow cathode plasma genrator and pressure regulating means that are operated to maintain an ambient pressure on said plasma generator in the range of about $1.5 \times 10^{-5}$ to $2.0 \times 10^{-5}$ torr, thereby to enable the production of said densities of dual population of electrons.

13. An invention as defined in claim 12 wherein said predetermined voltage biasing the bulk electron repelling grid is more positive than $-34$ volts, in combination with a positively biased grid positioned between the extraction electrode and the negatively biased bulk electron repelling grid, said positively biased grid being effective to repel ions from said beam back toward the source of plasma, thereby to maintain the low emittance of said beam as it passes through the extraction electrode.

14. An invention as defined in claim 10 wherein said predetermined densities comprise bulk electrons produced in a density range of about $10^{13}$ to $10^{15}$ bulk electrons per cu. cm. with a temperature spread of about 1 to 2 eV, and fast primary electrons produced in a density of about $10^9$ to $10^{12}$ fast primary electrons per cu. cm. with a thermal spread that is in the range of about 0.1 to 0.4 eV.

15. An invention as defined in claim 10 wherein said beam of fast primary electrons is a multi-ampere beam, in combination with a target workpiece that is electrically grounded to enable said beam to impact on the target as an electron welding beam for effectively welding the workpiece.

* * * * *